United States Patent
Tregub et al.

(10) Patent No.: US 7,288,300 B2
(45) Date of Patent: Oct. 30, 2007

(54) FULLERENES TO INCREASE RADIATION RESISTANCE IN POLYMER-BASED PELLICLES

(75) Inventors: Alexander Tregub, Oak Park, CA (US); Tim T. Chen, Phoenix, AZ (US); Susan Holl, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/226,489

(22) Filed: Sep. 13, 2005

(65) Prior Publication Data
US 2006/0008528 A1    Jan. 12, 2006

Related U.S. Application Data

(62) Division of application No. 10/403,963, filed on Mar. 31, 2003.

(51) Int. Cl.
*G03F 9/00* (2006.01)

(52) U.S. Cl. ............... 428/14; 205/782.5; 428/421; 524/495

(58) Field of Classification Search ............ 524/495; 428/14, 421; 205/782.5
See application file for complete search history.

(56) References Cited

U.S. PATENT DOCUMENTS

| | | | |
|---|---|---|---|
| 6,491,891 B1 * | 12/2002 | Klett et al. | 423/445 R |
| 6,528,231 B1 * | 3/2003 | Tajima et al. | 430/270.1 |
| 6,594,073 B2 * | 7/2003 | Wang | 359/350 |
| 6,908,572 B1 * | 6/2005 | Derbyshire et al. | 252/502 |
| 2002/0086553 A1 * | 7/2002 | O'Donnell et al. | 438/761 |
| 2003/0158323 A1 * | 8/2003 | Connell et al. | 524/495 |
| 2004/0034177 A1 * | 2/2004 | Chen | 525/416 |

OTHER PUBLICATIONS

Florence Eschbach, et al., Development of Polymer Membranes for 157 nm Lithography, Intel Corporation; Asahi Glass Company, LTD, Jan. 23, 2004, 14 pgs.

A. Tregub, et al., Development of Fluoropolymer Membranes Transparent and Resistant to 157 nm Exposure, 157 Symposium, Intel Corporation, Aug. 27, 2003, 34 pgs.

* cited by examiner

*Primary Examiner*—David W. Wu
*Assistant Examiner*—Henry Hu
(74) *Attorney, Agent, or Firm*—Blakely, Sokoloff, Taylor & Zafman LLP

(57) ABSTRACT

A pellicle made of a polymer material contains fullerenes within the polymer material to reduce the damaging effects of radiation that is transmitted through the pellicle during an exposure operation. The fullerenes may comprise nanotubes and/or buckyballs. The buckyballs may also enclose molecules of a gas that further reduce the damaging effects of the radiation on the polymer material.

6 Claims, 6 Drawing Sheets

FULLERENES TO INCREASE RADIATION RESISTANCE IN POLYMER-BASED PELLICLES

This is a Divisional application of Ser. No. 10/403,963 filed Mar. 31, 2003, which is presently pending.

BACKGROUND

1. Technical Field

An embodiment of the invention relates generally to integrated circuit manufacturing, and in particular relates to pellicles used in lithographic exposure operations.

2. Description of the Related Art

Reticles and photomasks are used during the manufacture of integrated circuits. Pellicles are used to protect the reticles and photomasks, keeping dust particles and other contaminants off the reticle/photomask surface, where the particles would otherwise cause defects in the exposure image. A pellicle is placed a predetermined distance from the reticle/photomask, the distance calculated in such a way that the dust particle image is not projected on the wafer. The exposure radiation must by necessity pass through the pellicle, so the pellicle needs to be essentially transparent at the wavelengths being used. Pellicles used with ultraviolet radiation are commonly made of a thin polymer film that is transparent at the required wavelengths.

As the features of integrated circuits become smaller, shorter wavelengths of exposure radiation are required. However, in the vacuum ultraviolet (VUV) ranges of less than 193 nanometers (nm), the radiation can cause the polymer material in conventional pellicles to deteriorate by generating free radicals. The free radicals not only destroy the physical and optical qualities of the polymer, but also generate reaction products that absorb the radiation and generate more free radicals. Thus the transmissiveness of the polymer at the desired wavelength degrades at an accelerating rate, greatly shortening the effective life cycle of the pellicle, and thereby limiting the number of exposure operations the pellicle/reticle assembly can be used for before it must be replaced.

BRIEF DESCRIPTION OF THE DRAWINGS

Embodiments of the invention may be understood by referring to the following description and accompanying drawings, in which.

DETAILED DESCRIPTION

In the following description, numerous specific details are set forth. However, it is understood that embodiments of the invention may be practiced without these specific details. In other instances, well-known structures and techniques have not been shown in detail in order not to obscure an understanding of this description.

References to "one embodiment", "an embodiment", "example embodiment", "various embodiments", etc., indicate that the embodiment(s) of the invention so described may include a particular feature, structure, or characteristic, but not every embodiment necessarily includes the particular feature, structure, or characteristic. Further, repeated use of the phrase "in one embodiment" does not necessarily refer to the same embodiment, although it may.

Some of the drawings show various physical aspects of embodiments of the invention. These drawings are not to scale, and do not imply relative dimensions of any physical elements, either relative to each other or relative to any other standard.

Various embodiments of the invention increase the radiation durability of pellicles by introducing fullerenes into the polymer material when the pellicles are manufactured. Numerous benzene rings in the fullerenes stabilize the free radicals which may be formed due to radiation, by localizing the free radicals and preventing their propagation. Fullerenes do not degrade under VUV radiation, and may act as scavengers in the polymer matrix to trap the free radicals before the free radicals can do much harm, and before the chain reaction of generating more free radicals can proceed very far. In some embodiments the fullerenes may contain gas molecules in their interior to further stop the free radicals.

Figure 1:
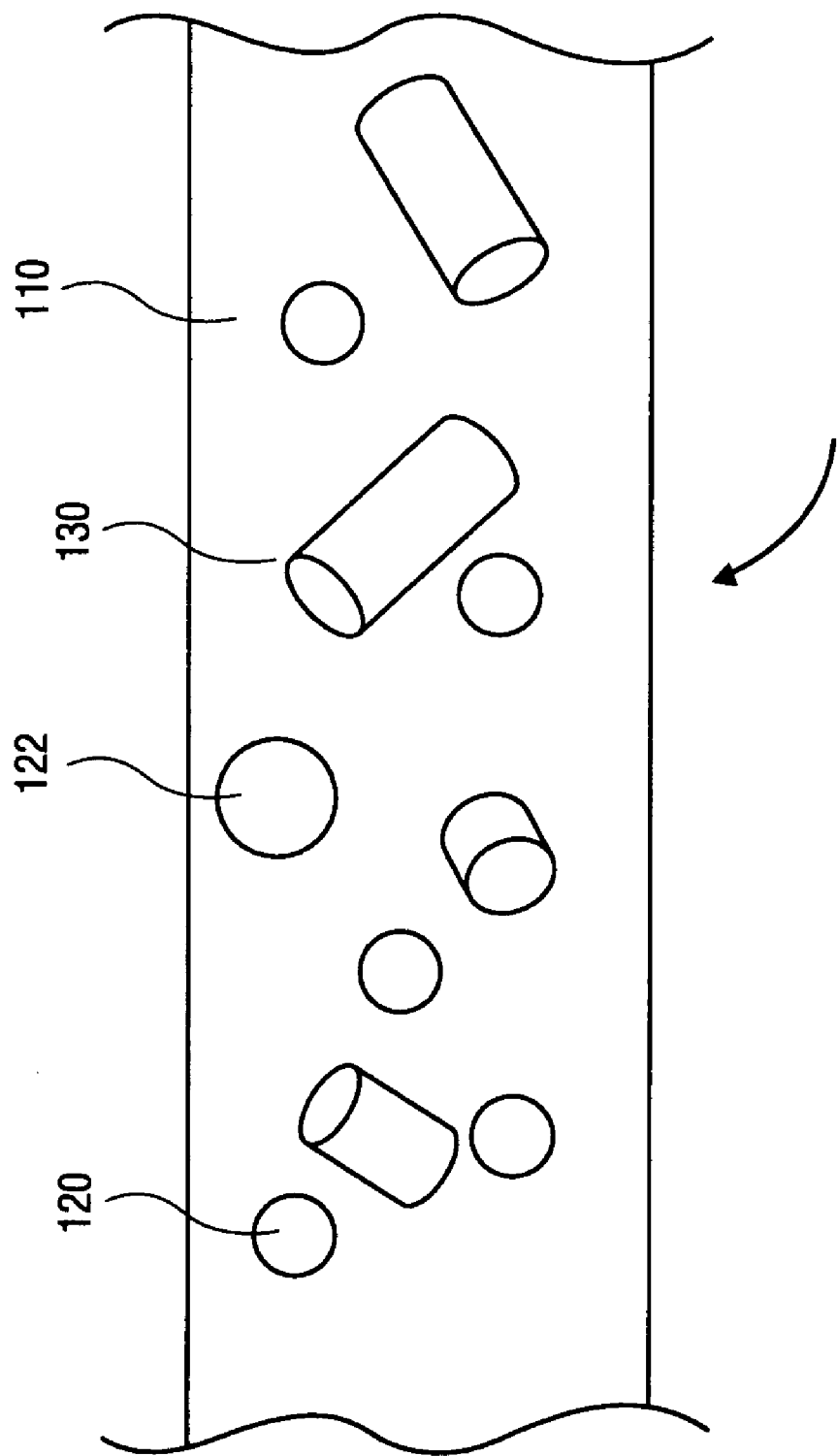
FIG. 1 shows a cross-section of a portion of a pellicle, according to one embodiment of the invention.

FIG. 1 shows a cross-section of a portion of a pellicle, according to one embodiment of the invention. Pellicle 100 may comprise a polymer material 110 which contains fullerenes. Fullerenes are structures at the molecular level made up of carbon atoms. Fullerenes are sometimes referred to as carbon molecules, but since this definition depends on the definition of "molecule", it should not be considered a limitation on embodiments of the invention. In the illustrated embodiment, the fullerenes are buckyballs 120, 122 and nanotubes 130. A buckyball is a structure in which the carbon atoms attach themselves to each other in the form of a hollow sphere. Various embodiments of the invention may include buckyballs in the form of $C_{60}$ (60 atoms of carbon joined into a sphere), $C_{70}$ (70 atoms of carbon joined into a sphere), and $C_{76}$ (76 atoms of carbon joined into a sphere), but other sizes may also be used. Buckyball 122 is shown larger than buckyball 120 to illustrate that different sizes may be used. In some embodiments, the buckyballs may range in size from 7-15 angstroms in diameter, but other sizes may be used.

A nanotube is a structure in which the carbon atoms attach themselves to each other to form a hollow tube. In various embodiments of the invention, either or both of single wall nanotubes (SWNT) and multiple wall nanotubes (MWNT) may be used. In some embodiments, the nanotubes may range in size from 50-100 angstroms in diameter, but other sizes may also be used. In some embodiments, the polymer in the pellicle may comprise a fluorocarbon polymer, but other embodiments may comprise other types of polymers.

In some embodiments the pellicle may have a thickness (the top-to-bottom dimension in the drawing) in the range of 0.5 to 3 microns, and a length and width of several centimeters, but other dimensions may also be used. The particular shape and the length and width of the pellicle may vary to be compatible with the size and shape of an attached reticle/mask. For clarity of illustration, the size of the fullerenes in the drawings are greatly enlarged compared to the thickness of the pellicle, and the size of the buckyballs are not necessarily shown in proportion to the size of the nanotubes. In one embodiment the concentration of fullerenes in the polymer material is in the range of 5 to 20 w.p (weight percent), but other concentrations may also be used.

In one embodiment the fullerenes are distributed approximately uniformly throughout the polymer material in the pellicle, but other embodiments may have a non-uniform distribution of fullerenes.

Figure 2:
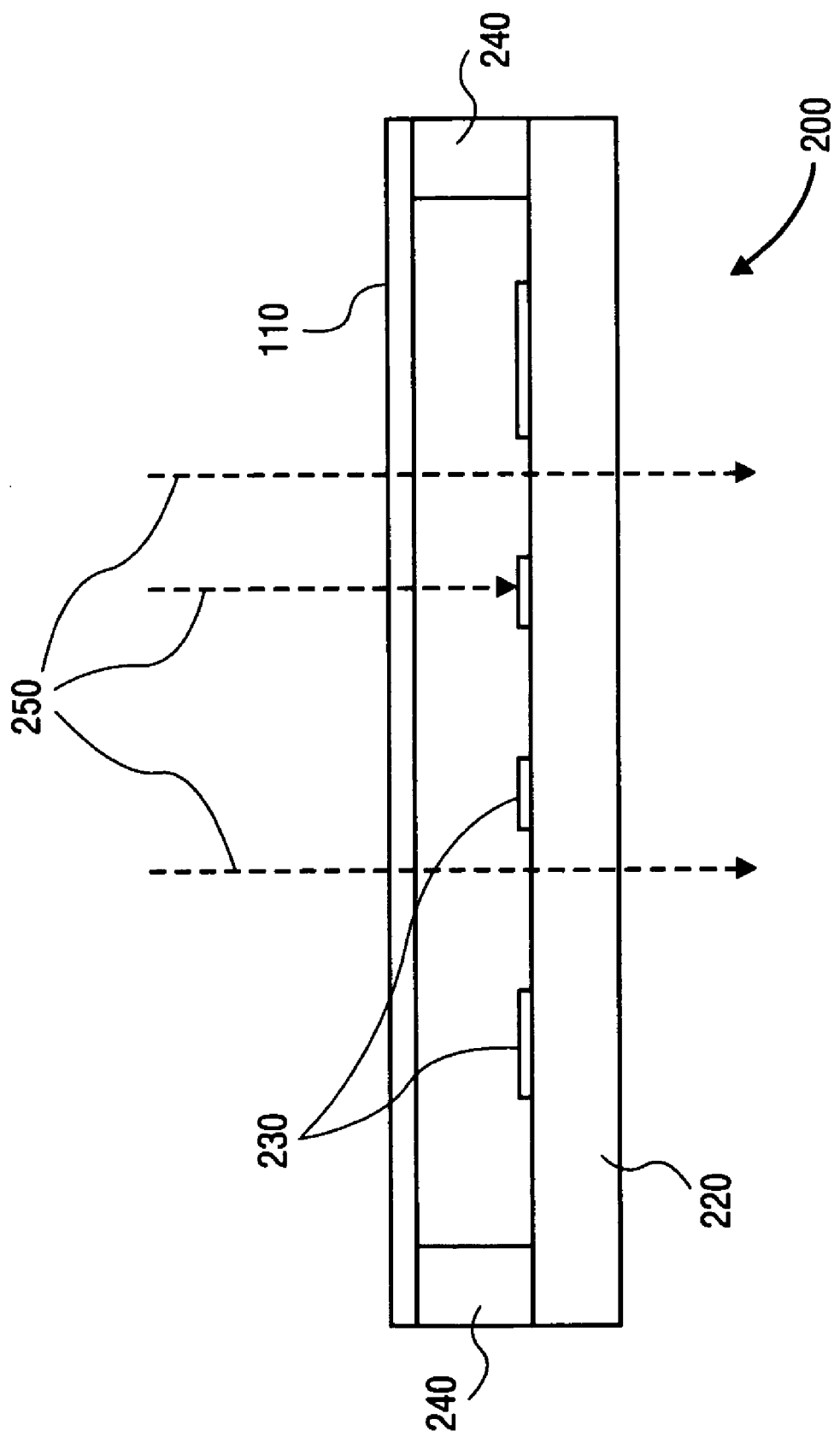
FIG. 2 shows a cross-section of a pellicle/reticle assembly, according to one embodiment of the invention.

FIG. 2 shows a cross-section of a pellicle/reticle assembly, according to one embodiment of the invention. In the illustrated embodiment, pellicle 110 is attached to frame 240, which is attached to reticle 220. Electromagnetic radiation 250 may be directed through the pellicle and reticle during lithographic processing used in, for example, the manufacture of integrated circuits. The pellicle 110 and the reticle 220 may be substantially transparent to the wavelength of electromagnetic radiation 250 being used. The patterning material 230 on one face of the reticle 220 may be used to help project the desired exposure pattern onto a photoresist layer of a wafer (not shown) during the manufacturing processes used on the wafer. Areas in which the patterning material is shown may block off the electromagnetic radiation, while areas without the patterning material may permit the radiation to continue on through, thus repeating the pattern (with appropriate scaling) on the face of the wafer. In one embodiment the electromagnetic radiation is in the vacuum ultraviolet (VUV) range with a wavelength of less than 193 nm, but other wavelengths may be used. In a particular embodiment the electromagnetic radiation has a wavelength of approximately 157 nanometers (nm).

The choice of fullerene(s) to be used in the pellicle may be based on the wavelength of electromagnetic radiation to be used in the exposure operation when the pellicle is in use. For example, electromagnetic radiation with a wavelength of 157 nm has an energy of approximately 7.9 electron volts (eV). The optical absorption of the fullerene $C_{60}$ has maximums at approximately 4.8 and 6.2 eV. Also, lattice fluctuations of the polymer may result in additional maximums at approximately 2.8 to 3.0 eV. Thus a polymer with $C_{60}$ buckyballs may not cause undue absorption of the 157 nm radiation and may be considered substantially transparent to the radiation at that wavelength. Optical absorption of $C_{70}$ buckyballs is similar to that of $C_{60}$ buckyballs.

Figure 3:
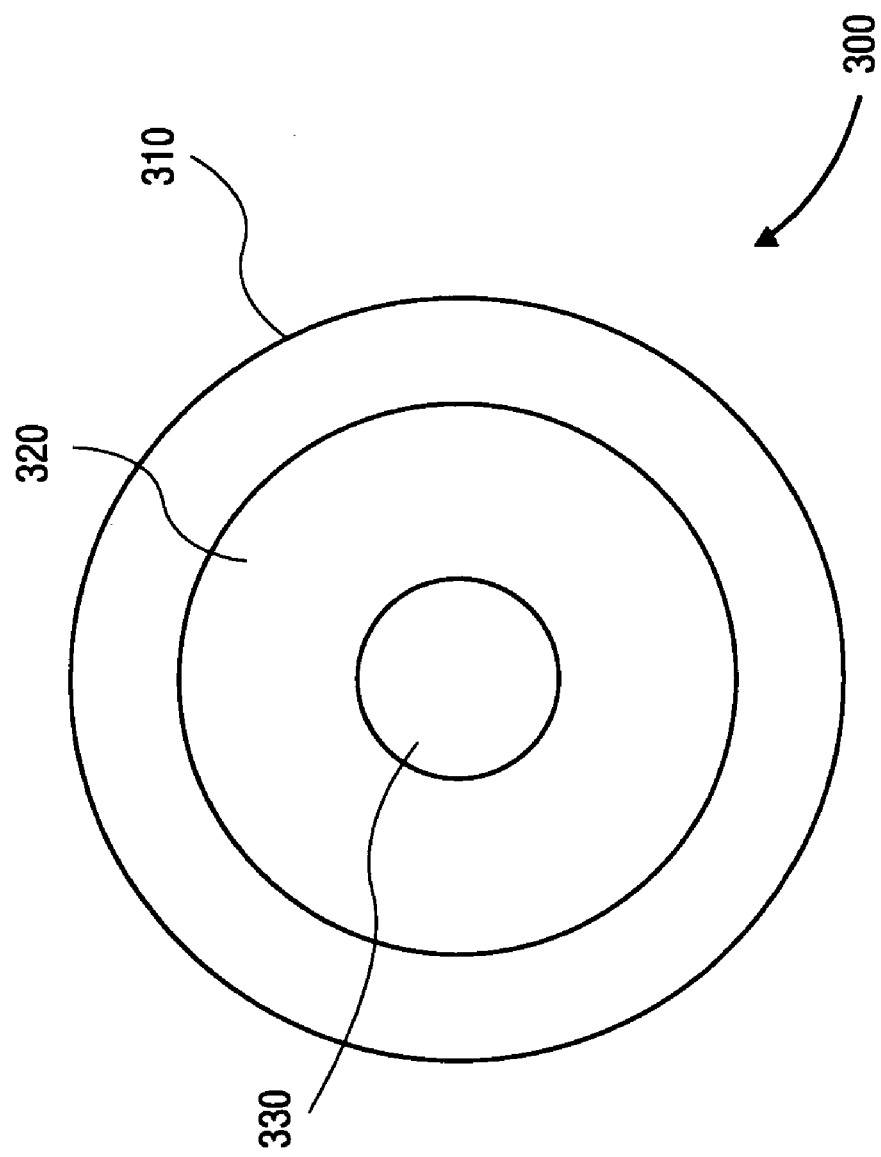
FIG. 3 shows a cross-section of a buckyball with at least one molecule of a gas trapped inside, according to one embodiment of the invention.

FIG. 3 shows a cross-section of a buckyball with one or more molecules of a gas trapped inside, according to one embodiment of the invention. In the illustrated embodiment, buckyball 300 comprises a shell 310 of carbon atoms, an inner space within the shell, and a gas molecule 330 trapped within that inner space inside the shell.

FIG. 3 is a conceptual drawing, and is not intended to portray the exact physical appearance of the items shown. Although the shell 310 is shown as a solid contiguous structure, much like an egg shell, it is understood that the actual physical appearance of linked carbon atoms may be much different that the solid form shown. Likewise, the sphere that represents gas molecule 330 is conceptual, and may not represent the actual physical shape of a molecule.

Molecule 330 is shown trapped within the shell 310 of buckyball 300. Techniques for trapping molecules within a buckyball are known and are not repeated here to avoid obscuring an understanding of the remaining text. Molecule 330 may be of a gas that also acts as a scavenger for free radicals, thus enhancing and/or increasing the effect that the fullerenes have. In a particular embodiment, molecule 330 is an oxygen molecule. Oxygen is known to nullify free radicals. However, free oxygen in a reaction chamber may cause damage to the optics of an exposure tool, and is thus unsuitable for this purpose. However, when trapped within a buckyball, the oxygen is no longer free and cannot cause such damage, while still being available to nullify free radicals through the shell of the buckyball. In other embodiments, molecule 330 may comprise other gaseous elements such as an inert gas and/or a noble gas (e.g., nitrogen, helium, etc.)

Figure 4:
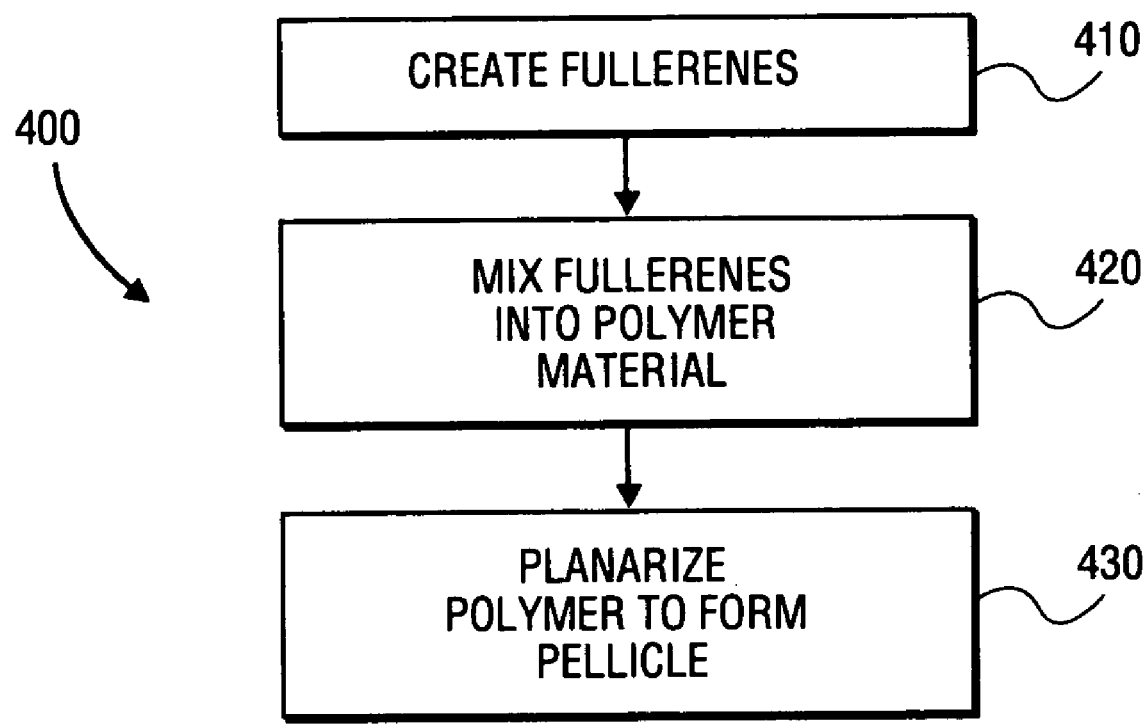
FIG. 4 shows a flow chart of a process to produce a pellicle containing fullerenes, according to one embodiment of the invention.

FIG. 4 shows a flow chart of a process to produce a pellicle containing fullerenes, according to one embodiment of the invention. In flow chart 400, fullerenes are created at 410. Techniques for creating nanotubes, buckyballs, and buckyballs with trapped molecules inside are known, and are not repeated here to avoid obscuring an understanding of the remaining text.

At 420 the fullerenes are mixed in with a polymer material. Various techniques for mixing may be used, e.g., dissolving the fullerenes in solution and filtering by the polymer matrix, synthesizing by in situ polymerization of monomers of interest, the use of ultrasonics, etc.

At 430 the polymer matrix containing the fullerenes is planarized to produce a pellicle with the shape and surface characteristics needed for use. In one embodiment, a thin polymer film containing fullerene particles is produced using a spin-on procedure (a procedure commonly used with conventional polymer-based pellicles), but other techniques may also be used.

Figure 5:
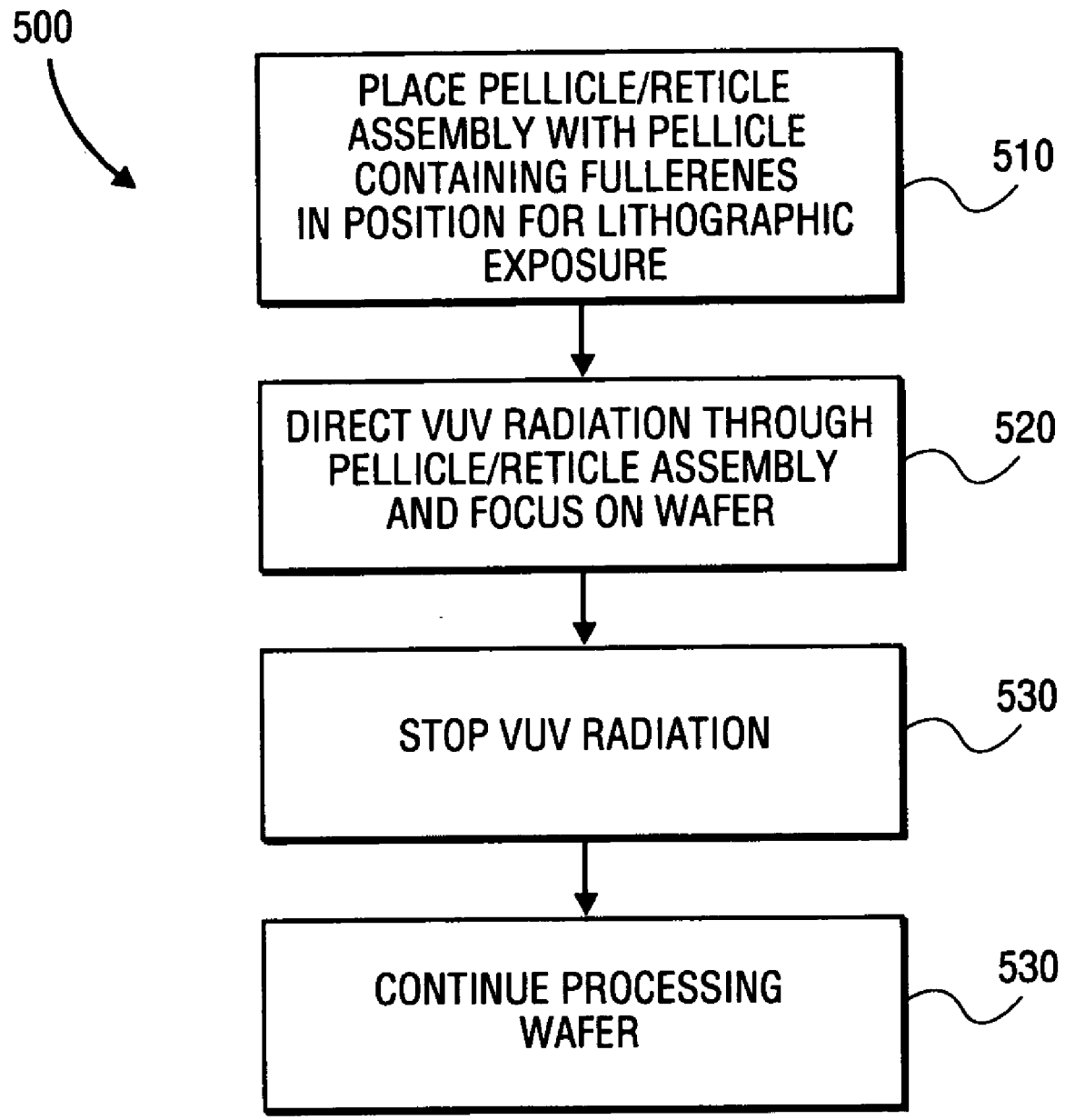
FIG. 5 shows a flow chart of a process to use a pellicle containing fullerenes, according to one embodiment of the invention.

FIG. 5 shows a flow chart of a process to use a pellicle containing fullerenes, according to one embodiment of the invention. In flow chart 500, at 510 a pellicle/reticle assembly, with the pellicle containing fullerenes, is placed into position for a lithographic exposure operation. At 520, electromagnetic radiation is directed through the pellicle/reticle assembly and is focused on a wafer. In one embodiment, this exposure operation is used to pattern a layer of photoresist on the wafer during the fabrication of integrated circuits. After exposure the photoresist may be developed to produce an etch mask, using the remaining photoresist material to protect specific areas of the underlying layer from being etched. In one embodiment the electromagnetic radiation has a wavelength of less than 193 nm. In a particular embodiment the electromagnetic radiation is in the VUV range.

After sufficient exposure time, the electromagnetic radiation is stopped at 530. In one embodiment a single exposure is made for the wafer. In another embodiment, small areas of the wafer are exposed sequentially in a series of step-and-advance operations by repeating the operations at 520 and 530. At 540, processing of the wafer may continue with other operations not requiring the pellicle/reticle assembly.

The cumulative exposure experienced by the pellicle may depend on the intensity of the radiation, the duration of each exposure operation, and the number of exposure operations. The cumulative effects of the exposure on the material in the pellicle may depend on those factors and also on the wavelength of the electromagnetic radiation.

Figure 6:
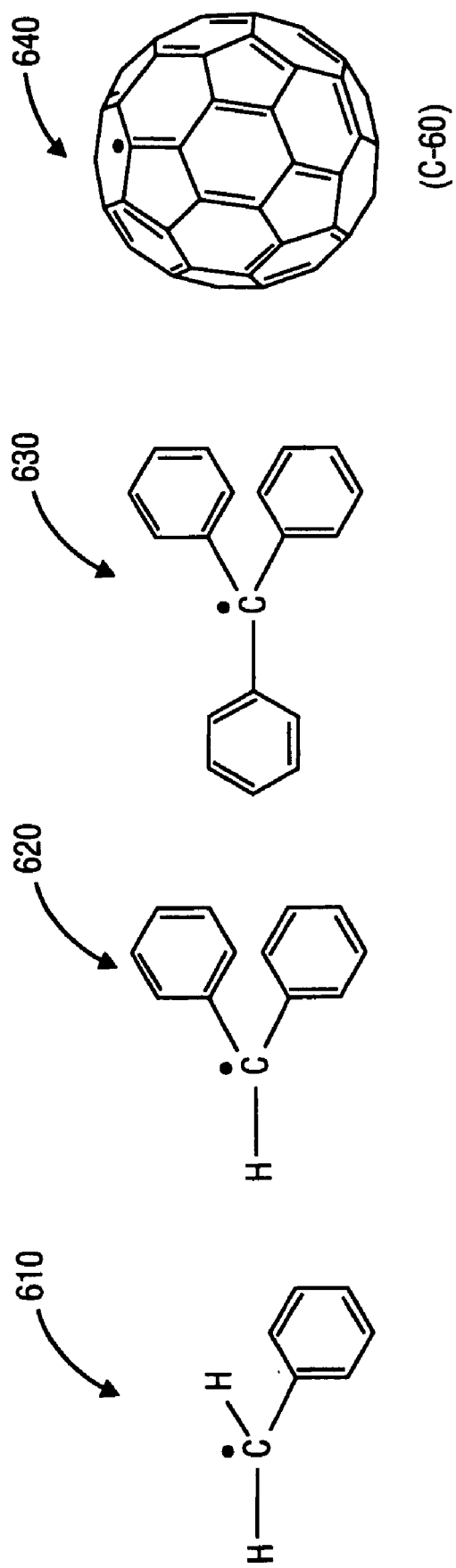
FIG. 6 shows the mechanism in which a fullerene stabilizes a free radical, according to one embodiment of the invention.

FIG. 6 shows how a fullerene stabilizes a free radical, according to one embodiment of the invention. Molecular structure 610 shows a carbon atom with three of its four valence electrons bound to two hydrogen atoms and a benzene ring, with the excess electron creating the free radical. Since a benzene ring contains six carbon atoms, the unbound electron may move between any of seven carbon atoms through the conjugated π-bonding system, making it less likely to move into a surrounding polymer structure where it could create the previously mentioned damaging effects. This is referred to as stabilizing the free radical. Molecular structure 620 has two benzene rings, giving a total of 13 carbon atoms to keep the extra electron within this π-electron bonding structure rather than jumping to another nearby molecular structure, thereby increasing the stabilizing effect on free radicals. Structure 630 has 19 carbon atoms, for even more stabilization. Molecular structure 640 is a C-60 buckyball containing 60 carbon atoms within which an electron may move around this extended π-electron bonding structure, thereby greatly increasing the stabilizing effect on free radicals. A nanotube (not shown) would have a similar effect, since it contains many carbon atoms linked together. Having a significant number of fullerenes in a polymer may therefore act to significantly stabilize free radicals caused by high energy radiation, thereby significantly reducing the damage caused by such free radicals in the polymer.

The foregoing description is intended to be illustrative and not limiting. Variations will occur to those of skill in the art. Those variations are intended to be included in the various embodiments of the invention, which are limited only by the spirit and scope of the appended claims.

What is claimed is:

1. A method, comprising:
combining a polymer material with fullerenes; and
planarizing the polymer material containing fullerenes to form a pellicle,
wherein the concentration of fullerenes in the pellicle is based on a wavelength of an exposure radiation on the pellicle to substantially reduce damaging effects of radiation transmitted through the pellicle, the polymer material in the pellicle substantially resistant to the damaging effects of radiation at a wavelength of 157 nm, the concentration of fullerenes is such that free radicals formed in the pellicle due to radiation are prevented from propagating themselves.

2. The method of claim 1, further comprising:
enclosing molecules of a gas within at least some of the fullerenes prior to said combining.

3. The method of claim 2, wherein:
said enclosing comprises enclosing molecules of oxygen within said at least some of the fullerenes.

4. The method of claim 2, wherein:
said enclosing comprises enclosing said molecules of a gas within buckyballs.

5. The method of claim 1, wherein:
said combining comprises combining the polymer material with buckyballs.

6. The method of claim 1, wherein:
said combining comprises combining the polymer material with nanotubes.

* * * * *